United States Patent
Koike et al.

(10) Patent No.: US 11,476,223 B2
(45) Date of Patent: Oct. 18, 2022

(54) SEMICONDUCTOR DEVICE AND MANUFACTURING METHOD THEREOF

(71) Applicants: Kabushiki Kaisha Toshiba, Tokyo (JP); Toshiba Electronic Devices & Storage Corporation, Tokyo (JP)

(72) Inventors: Daisuke Koike, Tokyo (JP); Fumiyoshi Kawashiro, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/775,557

(22) Filed: Jan. 29, 2020

(65) Prior Publication Data
US 2021/0066234 A1 Mar. 4, 2021

(30) Foreign Application Priority Data

Sep. 2, 2019 (JP) .............................. JP2019-159281

(51) Int. Cl.
*H01L 23/00* (2006.01)
*H01L 23/495* (2006.01)

(52) U.S. Cl.
CPC ........ *H01L 24/32* (2013.01); *H01L 23/49513* (2013.01); *H01L 24/29* (2013.01); *H01L 24/83* (2013.01); *H01L 2224/2929* (2013.01); *H01L 2224/29339* (2013.01); *H01L 2224/29344* (2013.01); *H01L 2224/29347* (2013.01);
(Continued)

(58) Field of Classification Search
CPC ......... H01L 23/49534; H01L 23/49822; H01L 23/4985; H01L 23/49861; H01L 23/49582; H01L 23/49866–49888; H01L 23/49586; H01L 23/49894; H01L 23/49513; H01L 2224/8384; H01L 2224/32059;
(Continued)

(56) References Cited

U.S. PATENT DOCUMENTS

2011/0290863 A1* 12/2011 Kajiwara ............... B23K 1/206
228/227
2012/0181710 A1 7/2012 Vaupel
(Continued)

FOREIGN PATENT DOCUMENTS

| JP | S61-8911 A | 1/1986 |
|---|---|---|
| JP | 2013-118322 A | 6/2013 |

(Continued)

*Primary Examiner* — Julio J Maldonado
*Assistant Examiner* — Stanetta D Isaac
(74) *Attorney, Agent, or Firm* — Allen & Overy LLP

(57) ABSTRACT

A semiconductor device according to an embodiment includes a lead frame, a semiconductor chip provided above the lead frame, and a bonding material including a sintered material containing a predetermined metal material and a predetermined resin, where the bonding material includes a first portion provided between the lead frame and the semiconductor chip, and a second portion provided on the lead frame around the semiconductor chip, where the bonding material bonds the lead frame and the semiconductor chip, wherein an angle formed by a lower face of the semiconductor chip and an upper face of the second portion adjacent to the lower face is 80 degrees or less.

14 Claims, 4 Drawing Sheets

(52) U.S. Cl.
CPC .............. *H01L 2224/32059* (2013.01); *H01L 2224/32245* (2013.01); *H01L 2224/8384* (2013.01)

(58) Field of Classification Search
CPC . H01L 2224/29344; H01L 2224/29347; H01L 2224/29339
See application file for complete search history.

(56) References Cited

U.S. PATENT DOCUMENTS

| | | |
|---|---|---|
| 2015/0069638 A1 | 3/2015 | Hiratsuka et al. |
| 2019/0043791 A1 | 2/2019 | Haga |

FOREIGN PATENT DOCUMENTS

| | | |
|---|---|---|
| JP | 2015-56238 A | 3/2015 |
| JP | 2016-219600 A | 12/2016 |
| JP | 2017-022033 A | 1/2017 |
| JP | 2019-29662 A | 2/2019 |

\* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2019-159281, filed on Sep. 2, 2019, the entire contents of which are incorporated herein by reference.

FIELD

Embodiments described herein relate generally to a semiconductor device and a manufacturing method thereof.

BACKGROUND

Power semiconductor chips designed for power control have been developed which are a metal oxide semiconductor field effect transistor (MOSFET), an insulated gate bipolar transistor (IGBT) and the like used in a wide range of fields such as power generation and power transmission, rotating machines such as pumps and blowers, power supplies for communication systems and factories, railways with AC motors, electric vehicles, and home electric appliances.

Further, development of a semiconductor device as a power module including such a power semiconductor chip has been performed. Such semiconductor devices are required to have specifications such as high current density, low loss, and high heat dissipation.

DETAILED DESCRIPTION

Figure 1A:
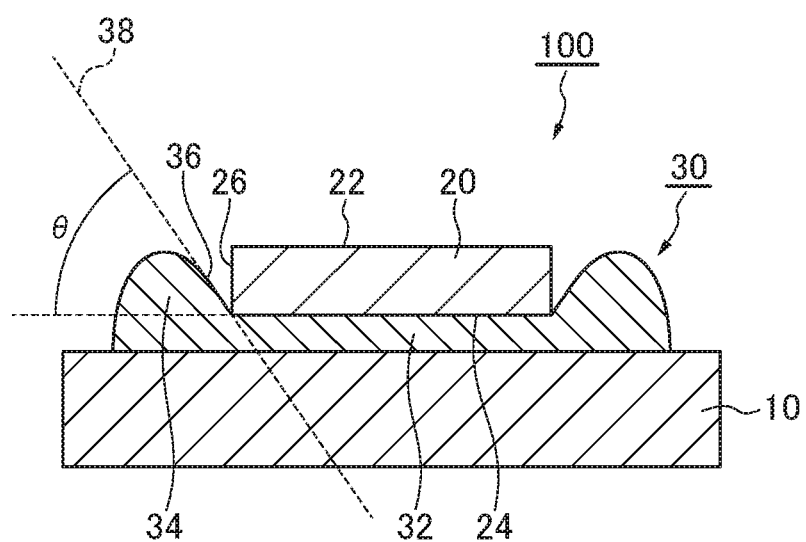
FIGS. 1A and 1B are schematic cross-sectional views of a semiconductor device of an embodiment.

Hereinafter, embodiments of the present disclosure will be described with reference to the drawings. In the following description, the same or similar members may be denoted by the same reference numerals. Further, description of members once described may be omitted as appropriate.

In the present specification, the upper direction of the drawing is described as "upper" and the lower direction of the drawing as "lower" in order to indicate the positional relationship of parts and the like. In the present specification, the terms "upper" and "lower" are not necessarily terms indicating the relationship with the direction of gravity.

Embodiment

A semiconductor device according to an embodiment includes a lead frame, a semiconductor chip provided above the lead frame, and a bonding material including a sintered material containing a predetermined metal material and a predetermined resin, where the bonding material includes a first portion provided between the lead frame and the semiconductor chip, and a second portion provided on the lead frame around the semiconductor chip, where the bonding material bonds the lead frame and the semiconductor chip, wherein an angle formed by a lower face of the semiconductor chip and an upper face of the second portion adjacent to the lower face is 80 degrees or less.

Figure 1B:
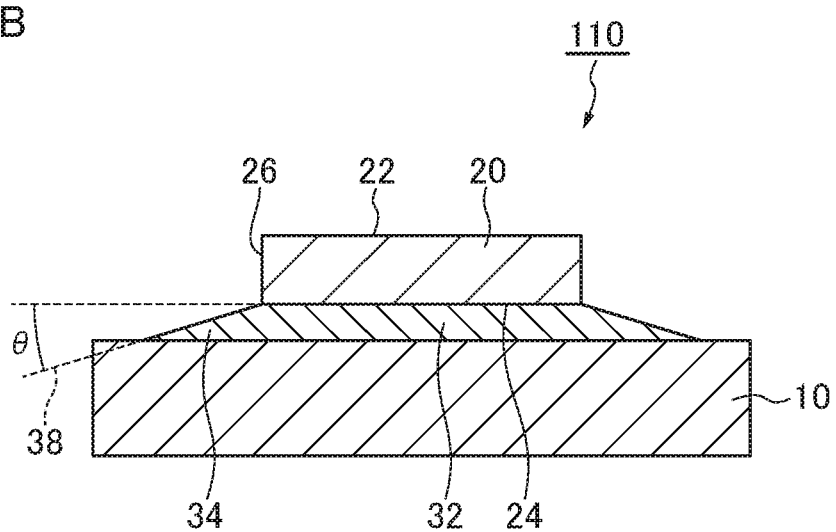

FIGS. 1A and 1B are schematic cross-sectional views of a semiconductor device 100 of an embodiment.

FIG. 1A is a schematic cross-sectional view of the semiconductor device 100 of according to an aspect of the present embodiment.

The semiconductor device 100 includes a lead frame 10, a semiconductor chip 20, and a bonding material 30.

The lead frame 10 is formed of a metal such as copper (Cu) or an alloy, for example. The surface of the lead frame 10 may be provided with a thin film including, for example, gold (Au), platinum (Pt), palladium (Pd), silver (Ag), copper (Cu), tin (Sn), nickel (Ni), or the like. A semiconductor chip 20 described later and an electric circuit outside the semiconductor device 100 are connected via the lead frame 10.

The semiconductor chip 20 has an upper face 22, a lower face 24, and a side face 26.

The semiconductor chip 20 is, for example, a vertical Si-IGBT including silicon (Si). The semiconductor chip 20 may be an Si-MOSFET, a fast recovery diode (Si-FRD), an SiC-IGBT, an SiC-MOSFET or a schottky barrier diode (SiC-SBD) including silicon carbide (SiC), or a GaN-MOSFET including a nitride semiconductor in which the group V element is nitrogen in a III-V group semiconductor. The semiconductor chip 20 may not be a so-called power semiconductor chip.

The chip thickness of the semiconductor chip 20 is preferably less than 200 μm.

The bonding material 30 includes a sintered material containing a predetermined metal material and a predetermined resin. The bonding material 30 bonds the lead frame 10 and the semiconductor chip 20 together. The bonding material 30 is a so-called die attach (DA) material. The bonding material 30 is obtained by heat-treating a paste 70 (FIGS. 3A to C and FIG. 4) containing metal particles containing the predetermined metal material, the predetermined resin, and a predetermined solvent such as a polar solvent, evaporating the predetermined solvent, and sintering the above metal particles.

Although the predetermined metal material is not particularly limited, the metal material including, for example, Au, Pt, Pd, ruthenium (Ru), rhodium (Rh), iridium (Ir), silver (Ag), copper (Cu), nickel (Ni), zinc (Zn), bismuth (Bi), iron (Fe), molybdenum (Mo), aluminum (Al), chromium (Cr), vanadium (V), or the like is preferably used. As the predetermined metal material, a metal material including Ag, Cu or Au is particularly preferably used because of its high thermal conductivity and electrical conductivity.

Although the predetermined resin is not particularly limited, the resign including, for example, a polyethylene resin, a polypropylene resin, a vinyl chloride resin, a polystyrene resin, an acrylonitrile styrene resin, an ABS resin, a polyethylene terephthalate resin, a methacrylic resin, a polyvinyl alcohol resin, a vinylidene chloride resin, a polycarbonate resin, a polyamide resin, an acetal resin, a polybutylene terephthalate resin, a fluororesin, a phenol resin, a melamine resin, a urea resin, a polyurethane resin, an epoxy resin, an unsaturated polyester resin, or the like is preferably used. As the predetermined resin, a resin including an epoxy resin is particularly preferably used.

The paste 70 preferably includes 5 wt % or more and 30 wt % or less of the predetermined resin.

The bonding material 30 includes a first portion 32 provided between the lead frame 10 and the semiconductor chip 20 and a second portion 34 provided on the lead frame 10 around the semiconductor chip 20. The bonding material 30 has a rounded shape as shown in FIG. 1A around the semiconductor chip 20. In the semiconductor device 100 shown in FIG. 1A, the height of the second portion 34 is higher than the height of the first portion 32. Note that the height of the second portion 34 may not be even around the semiconductor chip 20, and may have a portion where the height is partially low.

An angle θ formed by the lower face 24 of the semiconductor chip 20 and the upper face 22 of the second portion 34 adjacent to the lower face 24 of the semiconductor chip 20 is 80 degrees or less. Here, the "angle θ formed" is an angle formed by an extension line of the lower face 24 of the semiconductor chip 20 and a tangent line 38 with respect to the upper face 22 of the second portion 34 adjacent to the lower face of the semiconductor chip 20. The "angle θ formed" in FIG. 1A is a positive angle.

FIG. 1B is a schematic cross-sectional view of a semiconductor device 110 according to another aspect of the present embodiment. In the semiconductor device 110, the height of the second portion 34 is lower than the height of the first portion 32. As shown in FIG. 1B, the tangent line 38 is a line whose height decreases as the distance from the semiconductor chip 20 increases. The "angle θ formed" in FIG. 1B is a negative angle. In both FIG. 1A and FIG. 1B, the "angle θ formed" satisfies the condition of 80 degrees or less.

Figure 2:
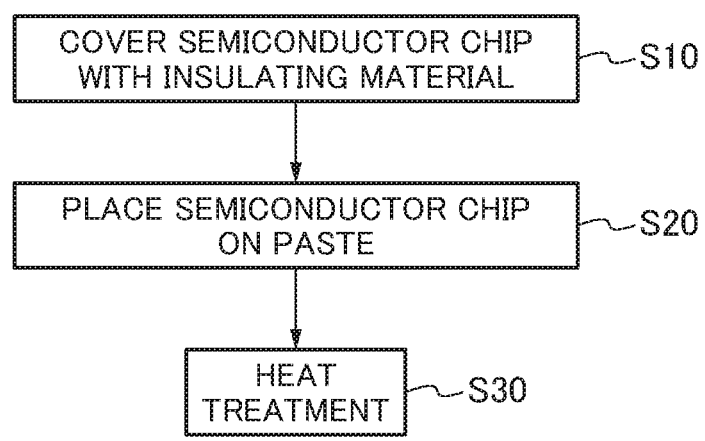
FIG. 2 is a flowchart of the manufacturing method of the semiconductor device of the present embodiment.

FIG. 2 is a flowchart of a manufacturing method of the semiconductor device 100 of the embodiment.

Figure 3A:
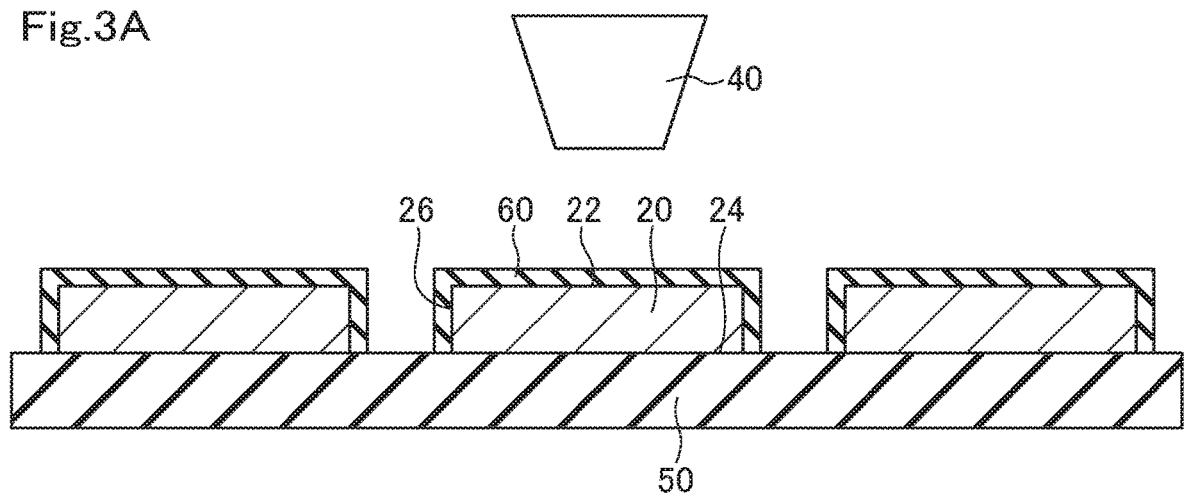
FIGS. 3A to 3C are schematic cross-sectional views showing the semiconductor device in the process of manufacture in the manufacturing method of the semiconductor device of the embodiment.
Figure 3B:
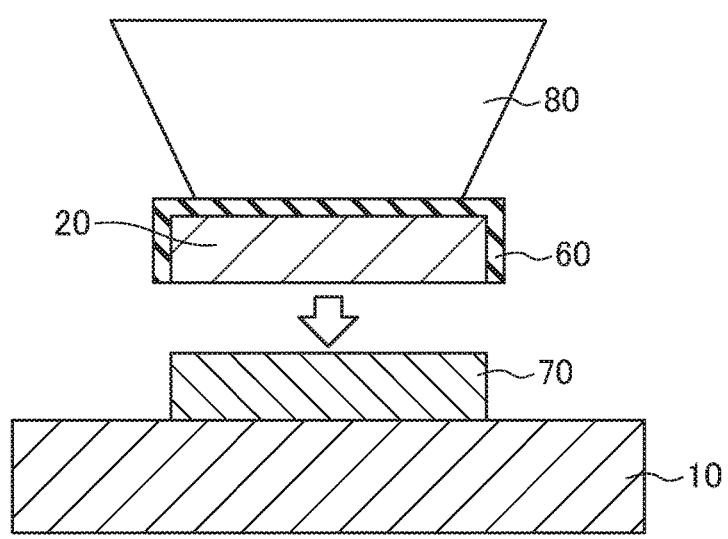
Figure 3C:
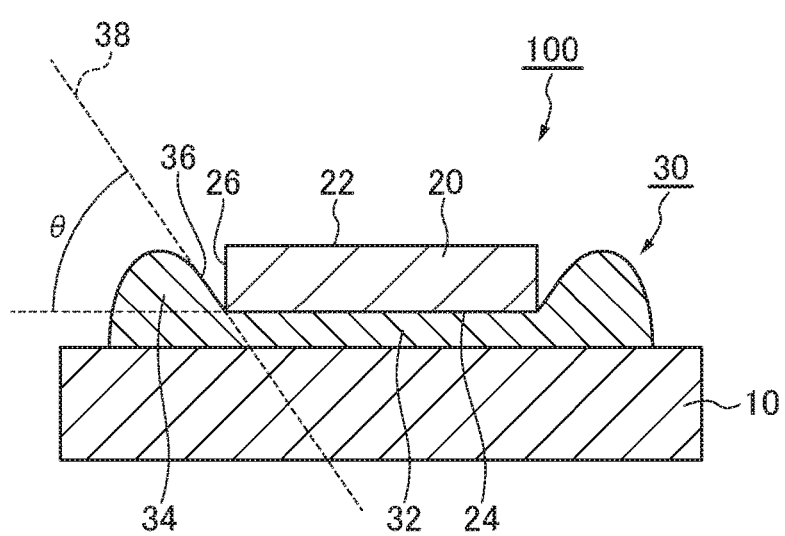

FIGS. 3A to 3C are schematic cross-sectional views showing the semiconductor device in the process of manufacture in the manufacturing method of the semiconductor device 100 of the embodiment.

A manufacturing method of the semiconductor device of the embodiment will be described with reference to FIGS. 2 and 3A to 3C.

A manufacturing method of a semiconductor device of the embodiment includes covering a side face of a semiconductor chip with an insulating material to repel a predetermined resin, placing the semiconductor chip on a paste provided on a lead frame, where the paste includes metal particles containing a predetermined metal material and the predetermined resin, and forming a bonding material by heat-treating the semiconductor chip, the paste and the lead frame, where the bonding material includes a sintered material containing a predetermined metal material and the predetermined resin, where the bonding material includes a first portion provided between the lead frame and the semiconductor chip, and a second portion provided on the lead frame around the semiconductor chip, where the bonding material bonds the lead frame and the semiconductor chip, where an angle formed by a lower face of the semiconductor chip and an upper face of the second portion adjacent to the lower face is 80 degrees or less.

First, for the semiconductor chip 20 on a sheet 50, the side face 26 and the upper face 22 of the semiconductor chip 20 is coated with an insulating material 60 to repel a predetermined resin included in the paste 70 using a spray 40 (S10 of FIG. 2, FIG. 3A).

Although at least the side face 26 of the semiconductor chip 20 is preferably covered with the insulating material 60, the upper face 22 may be covered with the insulating material 60.

The means used for covering the side face 26 and the upper face 22 of the semiconductor chip 20 with the insulating material 60 is not limited to the spray 40, and for example, a printing method, a spin coating method, an evaporation method, or the like may be used.

The insulating material 60 is not particularly limited, but is preferably an epoxy bleed-out (EBO) prevention agent when the predetermined resin is an epoxy resin.

Next, the semiconductor chip 20 on the sheet 50 is placed on the paste 70 provided on the lead frame 10 using, for example, an adsorption collet 80 (S20 of FIG. 2, FIG. 3B).

Next, the semiconductor chip 20, the paste 70, the lead frame 10, and the insulating material 60 are heat-treated, for example, in air or nitrogen gas, for example, at a temperature of 200 degrees centigrade or more to 350 degrees centigrade or less. In this way, by curing the paste 70, the bonding material 30 is formed such that the bonding material 30 includes a sintered material containing a predetermined metal material and a predetermined resin, the bonding material 30 includes the first portion 32 provided between the lead frame 10 and the semiconductor chip 20 and the second portion 34 provided on the lead frame 10 around the semiconductor chip 20, the bonding material 30 bonds the lead frame 10 and the semiconductor chip 20, and an angle formed by the lower face 24 of the semiconductor chip 20 and the upper face 22 of the second portion 34 adjacent to the lower face 24 is 80 degrees or less (S30 of FIG. 2, FIG. 3C). Note that the insulating material 60 volatilizes (sublimates) by heat treatment.

Next, the function and effect of the semiconductor device and the manufacturing method of the semiconductor device of the embodiment will be described.

Conventionally, solder has been used as a bonding material or a die attach (DA) material. Lead-free solders are being promoted from the viewpoint of environmental protection. However, since a large amount of heat is generated with a large current at the bonding portion of the power module, it has been difficult to make the bonding portion lead-free. Furthermore, in recent years, development of power modules including a wide band gap semiconductor (SiC, nitride semiconductor) capable of operating at a higher temperature than that of a case of using silicon has been progressing. The operating temperature of power modules including the wide band gap semiconductor is expected to reach about 300° C. For this reason, the bonding material is required to have heat resistance higher than heat resistance which a general solder can have.

As a bonding material that can solve this problem, it is conceivable to use a bonding material that includes a paste including metal particles containing a predetermined metal material, a predetermined resin, and a predetermined solvent such as a polar solvent. This is because heat resistance is ensured, and further, sintering can be easily performed without applying pressure to the to-be-bonded portion by including a predetermined resin.

However, when bonding is performed using the above-described paste, there is a problem that the electrode provided on the lower face 24 and the electrode provided on the upper face 22 of the semiconductor chip 20 are short-circuited because the paste crawls up to the side face 26 and the upper face 22 of the semiconductor chip 20. Further, this problem is particularly likely to occur when the thickness of the semiconductor chip 20 is less than 200 µm in order to lower resistance of the semiconductor chip 20.

Figure 4A:
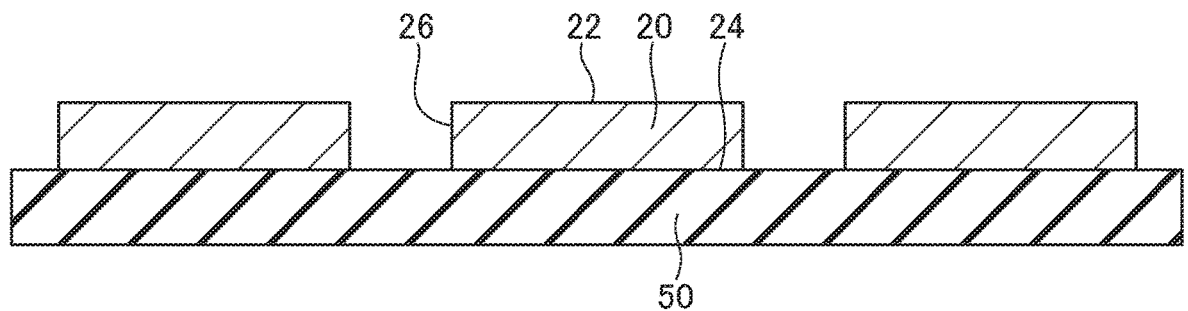
FIGS. 4A to 4C are schematic cross-sectional views showing the semiconductor device in the process of manufacture in the manufacturing method of the semiconductor device as a comparative embodiment.
Figure 4B:
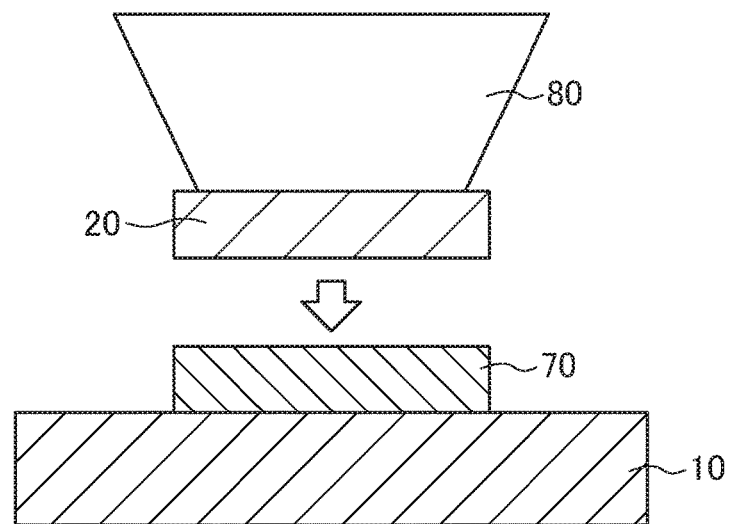
Figure 4C:
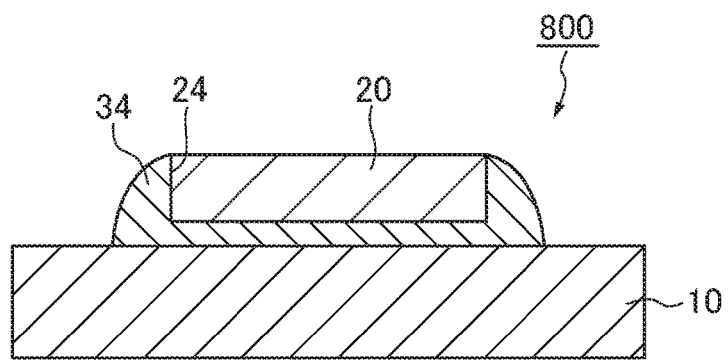

FIGS. 4A to 4C are schematic cross-sectional views showing the semiconductor device in the process of manufacture in the manufacturing method of a semiconductor device 800 as a comparative embodiment.

In FIG. 4A, the insulating material 60 is not used. When the semiconductor chip 20 is placed on the paste 70 as shown in FIG. 4B and heat-treated, there is a problem that the paste 70 crawls up the side face 26 of the semiconductor chip 20 as shown in FIG. 4C, as a result, the second portion 34 of the bonding material 30 has a crawl-up shape.

Therefore, in the manufacturing method of the semiconductor device 100 of the embodiment, the side face 26 and the upper face 22 of the semiconductor chip 20 are covered with the insulating material 60 to repel a predetermined resin included in the paste 70. Thereby, the paste 70 is cured without crawling up the side face 26 of the semiconductor chip 20. Therefore, it is possible to suppress the occurrence of a problem that the electrode provided on the lower face 24 and the electrode provided on the upper face 22 of the semiconductor chip 20 are short-circuited. Therefore, it is possible to provide a semiconductor device in which power loss is suppressed. As described above, the insulating material 60 volatilizes (sublimates) by the heat treatment. Therefore, it does not affect the bonding wire connectivity and the adhesion between the mold resin and the semiconductor chip 20 in the subsequent steps.

When the chip thickness of the semiconductor chip 20 is less than 200 µm, the problem that the paste 70 crawls up the side face 26 of the semiconductor chip 20, and the electrode provided on the lower face 24 and the electrode provided on the upper face 22 of the semiconductor chip 20 are short-circuited is particularly likely to occur. Therefore, when the chip thickness of the semiconductor chip 20 is less than 200 µm, the application of the semiconductor device and the manufacturing method of the semiconductor device of the embodiment is particularly preferable.

The film thickness of the covered insulating material 60 is preferably 0.1 µm or more and 2 µm or less. If the film thickness is less than 0.1 µm, the paste 70 may crawl up the side face 26 of the semiconductor chip 20 because the film thickness is not sufficient. On the other hand, if it exceeds 2 µm, it will not completely volatilize (sublimate) by the heat treatment, and some will remain, which may affect the bonding wire connectivity and the adhesion between the mold resin and the semiconductor chip 20.

When the insulating material 60 is used, the bonding material 30 has a shape different from that shown in FIG. 4C, and includes, as shown in FIGS. 1A and 1B, the first portion 32 provided between the lead frame 10 and the semiconductor chip 20, and the second portion 34 provided on the lead frame 10 around the semiconductor chip 20, and the angle formed by the lower face 24 of the semiconductor chip 20 and the upper face 22 of the second portion 34 adjacent to the lower face 24 is 80 degrees or less.

The paste 70 preferably includes 5 wt % or more and 30 wt % or less of the predetermined resin. This is because the semiconductor chip 20 and the lead frame 10 can be bonded well.

It is particularly preferable that the predetermined resin be an epoxy resin and the insulating material 60 is an epoxy bleed-out prevention agent. This is because sintering can be easily performed without applying pressure to the to-be-bonded portion, and the crawl-up of the paste 70 can be satisfactorily suppressed by the epoxy bleed-out prevention agent.

According to the semiconductor device 100 of the present embodiment, it is possible to provide a semiconductor device in which power loss is suppressed.

While certain embodiments have been described, these embodiments have been presented by way of example only, and are not intended to limit the scope of the inventions. Indeed, the semiconductor devices and a manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a lead frame;
a semiconductor chip provided above the lead frame; and
a bonding material including a sintered material containing a predetermined metal material and a predetermined resin, the bonding material including a first portion provided between the lead frame and the semiconductor chip, and a second portion provided on the lead frame around the semiconductor chip, the bonding material bonding the lead frame and the semiconductor chip, wherein
an angle formed by a lower face of the semiconductor chip and an upper face of the second portion adjacent to the lower face is 80 degrees or less.

2. The semiconductor device according to claim 1, wherein the predetermined resin includes a polyethylene resin, a polypropylene resin, a vinyl chloride resin, a polystyrene resin, an acrylonitrile styrene resin, an ABS resin, a polyethylene terephthalate resin, a methacrylic resin, a polyvinyl alcohol resin, a vinylidene chloride resin, a polycarbonate resin, a polyamide resin, an acetal resin, a polybutylene terephthalate resin, a fluororesin, a phenol resin, a melamine resin, a urea resin, a polyurethane resin, an epoxy resin, or an unsaturated polyester resin.

3. The semiconductor device according to claim 1, wherein the predetermined resin includes an epoxy resin.

4. The semiconductor device according to claim 1, wherein the semiconductor chip has a chip thickness of less than 200 µm.

5. The semiconductor device according to claim 1, wherein the bonding material is a die attach material.

6. The semiconductor device according to claim 1, wherein the predetermined metal material includes gold (Au), platinum (Pt), palladium (Pd), ruthenium (Ru), rhodium (Rh), iridium (Ir), silver (Ag), copper (Cu), nickel (Ni), zinc (Zn), bismuth (Bi), iron (Fe), molybdenum (Mo), aluminum (Al), chromium (Cr), or vanadium (V).

7. The semiconductor device according to claim 1, wherein the predetermined metal material includes silver (Ag), copper (Cu), or gold (Au).

8. The semiconductor device according to claim 1, wherein a height of the second portion is higher than a height of the first portion.

9. The semiconductor device according to claim 1, wherein a height of the second portion is lower than a height of the first portion.

10. The semiconductor device according to claim 1, wherein the bonding material has a rounded shape around the semiconductor chip.

11. The semiconductor device according to claim 1, wherein the highest portion of the second portion is provided separately from the semiconductor chip.

12. The semiconductor device according to claim 1, wherein a height of the second portion is lower than a height of the first portion, and wherein the height of the second portion decreases as the distance from the semiconductor chip increases.

13. The semiconductor device according to claim 1, wherein the semiconductor device has a side face, and the second portion is provided separately from the side face.

14. The semiconductor device according to claim 1, wherein the semiconductor device has a side face, and the second portion is not in contact with the side face.

* * * * *